United States Patent
Kitson et al.

(10) Patent No.: US 6,551,763 B1
(45) Date of Patent: Apr. 22, 2003

(54) METHOD FOR MANUFACTURE OF ELECTRONIC PARTS

(75) Inventors: Anthony Paul Kitson, West Yorkshire (GB); Peter Andrew Reath Bennett, Leeds (GB); Christopher David McCullough, Fort Collins, CO (US); Stuart Bayes, Leeds (GB); Kevin Barry Ray, Castleford (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/587,224

(22) Filed: Jun. 2, 2000

Related U.S. Application Data

(63) Continuation of application No. PCT/GB99/03314, filed on Oct. 6, 1999.

(30) Foreign Application Priority Data

Oct. 7, 1998 (GB) .............................................. 9821755

(51) Int. Cl.$^7$ ........................... G03F 7/039; G03F 7/09; G03F 7/30; G03F 7/26; G03F 7/20
(52) U.S. Cl. ........................ 430/311; 430/320; 430/326; 430/330; 430/331; 430/270.1; 430/277.1; 430/905; 430/910; 430/909; 430/945; 430/944
(58) Field of Search .......................... 430/311, 277.1, 430/270.1, 910, 944, 326, 330, 331, 18, 320, 905, 909, 945; 428/29, 457, 461, 901, 913; 250/316.1, 492.22; 427/335, 388.5, 160

(56) References Cited

U.S. PATENT DOCUMENTS

| | | | |
|---|---|---|---|
| 4,232,105 A | * 11/1980 | Shinohara et al. | 430/160 |
| 4,708,925 A | 11/1987 | Newman | 430/270 |
| 5,372,907 A | 12/1994 | Haley et al. | 430/157 |
| 5,384,357 A | * 1/1995 | Levinson et al. | 524/770 |
| 5,641,608 A | 6/1997 | Grunwald et al. | 430/302 |
| 5,761,990 A | * 6/1998 | Stewart et al. | 99/401 |
| 6,058,841 A | * 5/2000 | Ray et al. | 101/467 |
| 6,060,217 A | * 5/2000 | Nguyen et al. | 430/302 |
| 6,124,425 A | * 9/2000 | Nguyen | 428/913 |
| 6,168,898 B1 | * 1/2001 | Xu et al. | 430/176 |

FOREIGN PATENT DOCUMENTS

| | | |
|---|---|---|
| EP | 557138 | 8/1993 |
| EP | 0793144 A2 * | 9/1997 |
| GB | 1245924 | 9/1971 |
| GB | 1260662 | 1/1972 |
| JP | 5-113667 * | 5/1993 |
| WO | WO 9739894 | 10/1997 |
| WO | WO 9908879 | 2/1999 |

OTHER PUBLICATIONS

Derwent Abstract 1993–185601: English abstract for JP 5–113667 published on May 7, 1993.*

Machine translation of JP 5–113667 obtained from Japan Patent Office off the Internet, 1993.*

* cited by examiner

Primary Examiner—Janet Baxter
Assistant Examiner—Sin J. Lee
(74) Attorney, Agent, or Firm—Faegre & Benson LLP

(57) ABSTRACT

A composition used as a resist in the manufacture of electronic parts, for example printed circuits, and which is rendered soluble in a developer by patternwise delivery of heat, comprises a polymer and optionally an infrared absorbing compound. However in contrast to conventional compositions no compound is present which alters the solubility of the polymer in an aqueous developer.

10 Claims, No Drawings

METHOD FOR MANUFACTURE OF ELECTRONIC PARTS

CROSS REFERENCE TO RELATED APPLICATIONS

This application is a continuation of copending international application Serial No. PCT/GB99/03314 filed Oct. 6, 1999 and which published in English on Apr. 13, 2000, which in turn claims priority from U.K. Application No. GB 9821755.7, which was filed on Oct. 7, 1998.

BACKGROUND OF THE INVENTION

This invention relates to electronic parts and to their production using positive working radiation sensitive compositions.

We have developed novel radiation sensitive compositions and in our earlier-filed patent, application PCT/GB97/01117, published on Oct. 30, 1997, we disclose these novel compositions and their use as imagable coatings for lithographic printing form precursors. The compositions disclosed therein comprise a polymeric resin and a compound which we called a "reversible insolubilizer compound". The polymeric resin alone is relatively soluble in aqueous developers, but is rendered substantially less soluble in them by the presence of a reversible insolubilizer compound, in the compositions. However, on delivery of heat to the compositions the compositions become more readily soluble in aqueous developers. Hence, if heat is delivered in a pattern to the compositions, the pattern may be revealed by development in an appropriate aqueous developer.

We later determined that such compositions are suitable as radiation sensitive coatings for printed circuit and other electronic part precursors.

Up to now most commercial positive working printing plate compositions have contained naphthoquinodiazide (NQD) moieties as a "reversible insolubilizer compound", such compositions being imaged using UV radiation.

We have now devised compositions which are useful at least for forming patterns on electronic part precursors, and which, to our surprise, do not require any said "reversible insolubilizer compound". These compositions are able to record an image effectively, by means of heat, when freshly coated, but not, we believe, reliably thereafter. Therefore they are suitable for use as imagable compositions on electronic part precursors, where it is an industry practice for a single manufacturer to both apply an imagable composition to a precursor and to image the precursor, within a relatively short time frame.

The types of electronic parts whose manufacture may use a radiation sensitive coating include printed wiring boards (PWBs), thick- and thin-film circuits, comprising passive elements such as resistors, capacitors and inductors; multi-chip devices (MDCs); integrated circuits (ICs); and active semiconductor devices. The electronic parts may suitably comprise conductors, for example copper board; semiconductors, for example silicon or germanium; and insulators, for example silica as a surface layer with silicon beneath, with the silica being selectively etched away to expose portions of the silicon beneath (a step in the manufacture of e.g. field effect transistors)

A composition for use in the present invention is heat-sensitive in that localised heating of the composition, preferably by suitable electromagnetic radiation, causes an increase in the aqueous developer solubility of the exposed areas.

Therefore according to one aspect of the present invention there is provided a method of making an electronic part, the method comprising the steps of:
a) delivering heat selectively to regions of a precursor of the electronic part, the precursor comprising a surface carrying a coating, the coating comprising a heat-sensitive composition itself comprising an aqueous developer soluble polymeric substance but without any said "reversible solubilizer compound", wherein the aqueous developer solubility of the composition is increased by the said delivery of heat; and
b) developing the precursor in a said aqueous developer in order to remove the heat-sensitive composition in regions to which said heat was delivered.

The electronic part may, for example, be any of the electronic parts set out earlier in this specification. The said surface may thus be a semiconductor in which case the method may involve one or more subsequent doping steps selectively in regions in which the composition has been removed, such doping steps being for example by vapour phase, liquid immersion or by ion implantation methods. It may be an insulator which is etched to reveal a conductive or semiconductor layer below. For example it may be silica etched to reveal silicon. Alternatively it may be a conductive surface on which a wiring pattern is to be formed, for example by etching the printed circuit precursor in an etchant to remove said conductive surface selectively in the said regions. Preferably, when the surface is conductive it is a copper or a copper-rich alloy. Preferably such a surface is supported by an insulating substrate. The insulating substrate is suitably a dimensionally stable plastics board, for example of epoxy resin reinforced by glass fibres. There may be a conductive surface on one or both sides of the insulating substrate.

While the said surface defined herein may be an insulator requiring to be selectively subjected to etching in order to remove portions thereof to reveal an electroactive layer beneath it, preferably the said surface itself is an electroactive layer. By electroactive we mean a conductor, a semiconductor or a material which when doped functions as a semiconductor. Most preferably the said surface is conductive. It may suitably be a metallic sheet of thickness not exceeding 200 $\mu$m, preferably not exceeding 100 $\mu$m, most preferably not exceeding 30 $\mu$m.

When, as is preferred, an insulating substrate is provided, to support a conductive sheet on one or both sides thereof, the total thickness of the part, prior to application of a said coating, including the conductive sheet or sheets, preferably does not exceed 500 $\mu$m, more preferably does not exceed 300 $\mu$m.

A preferred part has a metal-insulator-metal sandwich structure.

According to a second aspect of the invention there is provided a precursor for an electronic part, which precursor comprises a surface (not being an aluminium surface which has undergone electrograining, anodising and post-anodic treatments) and a coating carried by the said surface, the coating being as defined above with reference to the first aspect.

In order to increase the sensitivity of the heat-sensitive compositions used in the present invention it is beneficial to include an additional component, namely a radiation absorbing compound capable of absorbing incident radiation and converting it to heat, hereinafter called a "radiation absorbing compound", but which does not also function as a reversible insolubilizer compound. A radiation absorbing compound is suitably a dye or pigment.

Therefore according to a further aspect of the present invention there is provided a precursor for an electronic part wherein said coating is adapted to preferentially absorb radiation and convert said radiation to heat.

In one embodiment of the present invention there is provided a heat-sensitive positive working precursor for an electronic part wherein the said coating includes an additional layer disposed beneath the heat-sensitive composition; wherein the additional layer comprises a radiation absorbing compound.

Preferably the aqueous developer solubility of the composition is not increased by incident UV radiation. When we state that the aqueous developer solubility of the composition is not increased by incident UV radiation we mean that it is not substantially increased (that is, by an amount which would mean that UV safelighting conditions would have to be employed) over a time span applicable to the manufacturing process involved—which in the case of electronic part manufacture means over a time span of up to 2 hours, preferably up to 6 hours, most preferably up to 24 hours. Insubstantial increases in solubility due to incident UV radiation, arising from ambient light, for example arising from daylight or ordinary white lights such as fluorescent strip lights, over such periods, may be tolerated within the scope of this invention.

Preferably the aqueous developer soluble polymeric substance is applied directly to the surface of the electronic part precursor, and is preferably used "fresh" that is, it is imaged, by the patternwise delivery of heat, within 14 days, preferably within 7 days, most preferably within 4 days (ie 96 hours), of the application of the polymeric substance to the surface.

Thus in accordance with the present invention an electronic part, whether a circuit or a circuit device, is obtained after heat-mode imaging and processing. Heated areas of the composition are rendered more soluble in the developing solution, than untreated areas. Therefore on imagewise exposure there is a change in the solubility differential of the unexposed composition and of the exposed composition. Thus, in the exposed areas the composition is dissolved, preferably to the extent of revealing the underlying surface. The revealed areas of the underlying surface can then be selectively subjected to a desired treatment, which in the case of electronic parts may entail etching, doping and/or deposition, and/or making electrical connections thereto. Desirably, after such treatment, the remaining areas of the composition are then removed. This may be achieved by heating the precursor to solubilise the remaining areas of the composition, then subjecting it to a developer; or, preferably, by subjecting it to a stripper liquid, for example acetone or strong alkali, for example an alkali metal hydroxide.

SUMMARY OF THE INVENTION

This invention is directed to a method of making an electronic part, the method comprising: a) delivering heat selectively to regions of a precursor of the electronic part, in which the precursor comprises a surface having a coating and the coating comprises a heat-sensitive composition which comprises a polymeric substance soluble in aqueous developer, but does not contain any compound which reduces the solubility of the polymeric substance in the aqueous developer, and the solubility of the heat-sensitive composition in the aqueous developer is increased by the selective delivery of heat; and b) developing the precursor in an aqueous developer to remove the heat-sensitive composition in regions to which the heat was delivered.

DETAILED DESCRIPTION OF THE INVENTION

We will now describe further the formation of a desired pattern on a precursor, by means of a method as defined above. The composition thereon is such that it is patternwise solubilized by heat, itself delivered patternwise. In broad terms there are three ways in which heat can be patternwise delivered to the composition, in use. These are:

the direct delivery of heat by a heated body, by conduction. For example the composition may be contacted by a heat stylus; or the reverse face of a metallic support surface onto which the composition has been coated may be contacted by a heat stylus.

the use of incident electromagnetic radiation to expose the composition, the electromagnetic radiation being converted to heat, either directly (which is preferred) or by a chemical reaction undergone by a component of the composition.

the use of charged-particle radiation, for example electron beam radiation. Clearly, at the fundamental level the charged-particle mode and the electromagnetic mode are convergent; but the distinction is clear at the practical level.

A coated precursor for an electronic part of the invention may be heat imaged indirectly by exposure to a short duration of high intensity radiation transmitted or reflected from the background areas of a graphic original located in contact with the recording material.

In preferred methods of the invention electromagnetic radiation is used to expose the composition, the wavelength thereof entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 800 nm. Suitably it is of wavelength entirely or predominantly below 1400 nm. More preferably it is of wavelength entirely or predominantly below 1200 nm. Most preferably it is of wavelength entirely or predominantly below 1150 nm, especially below 1100 nm. Thus, suitably it is of wavelength entirely or predominantly in the range 600 to 1400 nm, more preferably 700 to 1200 nm, most preferably 800 to 1150 nm, especially 800 to 1100 nm. The electromagnetic radiation is converted to heat, either directly or by a chemical reaction undergone by a component of the composition. The electromagnetic radiation could for example be infra-red or visible radiation. Infra-red radiation is preferred.

Preferably the radiation is delivered by a laser.

In contrast to compositions used on printing plates, compositions used in the present invention may suitably be non-oleophilic.

Suitably the aqueous developer soluble polymeric substance comprises a polymer of general formula

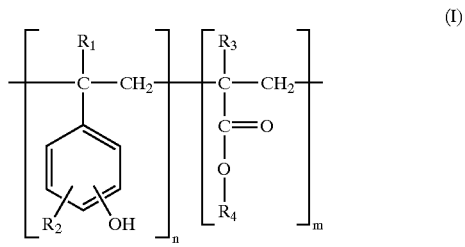

(I)

wherein $R^1$ represents a hydrogen atom or alkyl group, $R^2$ represents a hydrogen atom or alkyl group, $R^3$ represents a hydrogen atom or alkyl group, and $R^4$ represents an alkyl or hydroxyalkyl group, and wherein the ratio n/m is in the range 10/1 to 1/10.

In general terms, any alkyl group is suitably a $C_{1-12}$ alkyl group, preferably a $C_{1-6}$ alkyl group, especially a $C_{1-4}$ alkyl group. An alkyl group may be branched (for example t-butyl) or straight chain (for example n-butyl).

$R^1$ preferably represents a hydrogen atom or a $C_{1-4}$ alkyl group, especially a methyl group. Most preferably $R^1$ represents a hydrogen atom.

$R^2$ preferably represents a hydrogen atom or a $C_{1-4}$ alkyl group, especially a methyl group. Most preferably $R^2$ represents a hydrogen atom.

The hydroxy substituent of the phenyl group shown is preferably located para to the linkage of the phenyl group to the polymer backbone.

$R^3$ preferably represents a hydrogen atom or a $C_{1-4}$ alkyl group, especially a methyl group. Most preferably $R^3$ represents a hydrogen atom.

$R^4$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R^4$ are —$CH_3$, —$CH_2CH_2OH$, and —$CH_2CH_2CH_2CH_3$.

Preferably the ratio n/m is in the range 5/1 to 1/2. More preferably the ratio n/m is in the range 2/1 to 2/3. Most preferably the ratio n/m is in the range 3/2 to 2/3, especially 1/1.

The weight average molecular weight Mw of the polymer of general formula I, as measured by gel permeation chromatography, is preferably in the range 5,000–75,000, especially 7,000–50,000.

The number average molecular weight Mn of the polymer of general formula I is preferably in the range 2,000–20,000, especially 3,000–8,000.

Other polymers suitable for application in this invention include phenolic resins; poly-4-hydroxystyrene; copolymers of 4-hydroxystyrene, for example with 3-methyl-4-hydroxystyrene or 4-methoxystyrene; copolymers of (meth) acrylic acid, for example with styrene; copolymers of maleiimide, for example with styrene; hydroxy or carboxy functionalised celluloses; dialkylmaleiimide esters; copolymers of maleic anhydride, for example with styrene; and partially hydrolysed polymers of maleic anhydride.

Novolac resins are useful in this invention, suitably being condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare those phenolic resins generally known as novolacs which are thermoplastic in character. Higher aldehyde:phenol ratios of more then 1:1 to 3:1, and a basic catalyst would give rise to a class of phenolic resins known as resoles, and these are characterised by their ability to be thermally hardened at elevated temperatures.

The active polymer may be a phenolic resin. Particularly useful phenolic resins in this invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolac resins, resole resins and novolac/resole resin mixtures. Examples of suitable novolac resins have the following general structure.

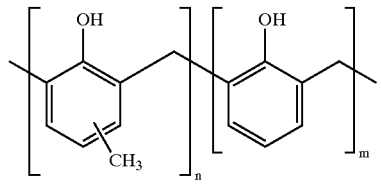

Another useful polymeric substance which does not thus interact is a polyvinyl($C_{1-4}$alkyl)ether compound, especially polyvinylethylether (PVEE). We have found such a compound to give a useful enhancement of the mechanical properties of the coating, in particular an improvement in its flexibility. When present such a compound is suitably present in an amount in the range 5–30%, by total weight of the composition. Thus, it is preferably present as an additional polymeric substance rather than as the sole polymeric substance.

Advantageously, the polymer of general formula I may be the only polymer used in the composition or it may be used in admixture with one or more other polymeric substances. In this event it preferably constitutes at least 20% of the weight of the composition, preferably at least 50%, most preferably at least 70%. There may be more than one polymer of general formula I. References herein to the proportion of such a polymer are to their total content.

The aqueous developer composition is dependent on the nature of the polymeric substance. Common components of aqueous lithographic developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates or being an alkali metal hydroxide. We have found an alkali metal hydroxide, for example sodium hydroxide or potassium hydroxide, to be suitable both as a developer and as a stripper.

A large number of compounds, or combinations thereof, can be utilised as radiation absorbing compounds in preferred embodiments of the present invention.

In preferred embodiments the radiation absorbing compound absorbs infra-red radiation, for example 1064 nm radiation from a Nd-YAG laser. However, other materials which absorb other wavelength radiation e.g. 488 nm radiation from an Ar-ion laser source, may be used with the radiation being converted to heat.

The radiation absorbing compound is preferably a pigment, which is a black body or broad band absorber. It may be carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

The radiation absorbing compound may alternatively be an infra-red absorbing dye able to absorb the radiation selected for imaging and convert it to heat, and whose absorption spectrum is significant at the wavelength output of the laser which is (in preferred embodiments) to be used in the method of the present invention.

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they have no or insignificant effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Many dyes have a marked effect on the solubility of the unheated composition in the developer, typically making it much less soluble, and use of such dyes is not within the ambit of the present invention.

Suitably the radiation absorbing compound, when present, constitutes at least 0.25%, preferably at least 0.5%, more preferably at least 1%, most preferably at least 2%, of the total weight of the composition. Suitably the radiation absorbing compound, when present, constitutes up to 25%, preferably up to 20%, and most preferably up to 15%, of the total weight of the composition. More specifically, in the case of dyes the range may preferably be 0.25–15% of the total weight of the composition, preferably 0.5–8%, whilst in the case of pigments the range may preferably be 1–25%, preferably 2–15%. For pigments, 5–15% may be especially suitable. In each case the figures given are as a percentage of the total weight of the dried composition. There may be more than one radiation absorbing compound. References herein to the proportion of such compound(s) are to their total content.

In accordance with a further aspect of the invention there is provided a kit for the production of electronic part precursors, the kit comprising a composition as defined herein, and surface material, the composition being in liquid form suitable for application to the surface material, to provide it on drying with said coating. Preferably the composition is supplied in a solvent, which is driven off during a drying step, to leave the composition in the form of a solid layer or film. Suitable solvents include 1-methoxypropan-2-ol and 1-methoxy-2-propyl acetate. The amount of solvent used depends upon various parameters, for example the nature of the solvent and of the components of the composition, the coating weight and thickness required, and the coating technique employed. Generally it is desired to minimize the amount of solvent used. When a pigment is used as a radiation absorbing compound it is suitably milled, preferably with some or all of the polymer(s) of the composition. The solids content of such a composition, as applied, is preferably 10–40%, especially 15–30%, by total weight of the composition (including solvent). Such a composition suitably has a particle size of less than 10 $\mu$m, more preferably less than 5 $\mu$m, most preferably less than 1 $\mu$m, as determined by grind gauge. Preferably the surface material is a conductive material. Suitably the kit includes a developer. Suitably the kit includes a stripper liquid. Alternatively the kit may include a single liquid which can function as a developer and a stripper.

Alternatively a precursor may be supplied with a said composition already provided as a coating thereon.

In one preferred embodiment of the invention an additional layer comprising a radiation absorbing compound can be used. This multiple layer construction can provide routes to high sensitivity as larger quantities of absorber can be used without affecting the function of the imaging forming layer. In principle any radiation absorbing material which absorbs sufficiently strongly in the desired wavelength can be incorporated or fabricated in a uniform coating. Dyes, metals and pigments (including metal oxides) may be used in the form of vapour deposited layers, techniques for forming and use of such films are well known in the art, for example EP 0,652,483.

The compositions of the invention may contain other ingredients such as stabilising additives, surfactants, plasticisers, inert colourants, additional inert polymeric binders as are present in many radiation sensitive compositions.

Preferably the heat-sensitive compositions of the present invention do not comprise UV sensitive components. However, UV sensitive components which are not UV activated due to the presence of other components, such as inert UV absorbing dyes or a UV absorbing topmost layer, and which do not function as reversible insolubilizer compounds, may be present.

It is important that the entire surface of the precursor before development is covered by the heat-sensitive composition, and that the non-heated areas of the surface after development remain covered.

Preferably the mean peak to valley height Rz (as measured by test DIN 4777) of the surface of the precursor to which the composition is applied is less than 5 $\mu$m, preferably less than 2 $\mu$m (when measured in any direction)

Prior to the application of the coating to the precursor the precursor is preferably treated with a cleaning or anti-tarnishing agent, suitably an acid, for example aqueous citric acid, then rinsed thoroughly and dried.

Preferably the sensitivity of the preferred compositions should be at a practicable level but suitably no more than 600 mJcm$^{-2}$, preferably no more than 400 mJcm$^{-2}$, more preferably no more than 300 mJcm$^{-2}$.

Any feature of any aspect of the present invention or embodiment described herein may be combined with any feature of any other aspect of any invention or embodiment described herein.

The following Examples more particularly serve to illustrate the various aspects of the present invention described hereinabove.

The following products are referred to hereafter:

Resin E—LB6564, a 1:1 phenol/cresol novolac resin supplied by Bakelite, UK.

Resin J—Ronacoat RO3000 RY37/12, a dimethylmaleimide ester supplied by Rohner Limited of Pratteln, Switzerland.

Resin L—a copolymer of p-vinylphenol having the structure:

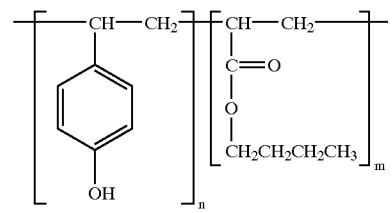

n/m=50/50, M$_w$=21,000 as supplied by Siber Hegner Ltd, Beckenham, UK.

Prussian Blue (ferric ferrocyanide, CI Pigment Blue 27) supplied by Aldrich Chemical Company, of Dorset, UK.

Carbon black FW2—a channel type carbon black supplied by Degussa of Macclesfield, UK.

PVEE—Poly(vinylethylether) supplied by Aldrich.

Developer A—14 wt % sodium metasilicate pentahydrate in water.

Developer B—7.5 wt % sodium metasilicate pentahydrate in water.

Developer D—0.2M NaOH in water.

Copper Substrate A—double sided copper laminate of overall thickness 254 μm, having copper cladding 18 μm thick on each side of an insulating substrate, catalogue number N4105-2, 0.008, H/H HTE, as supplied by New England Laminates (UK) Limited of Skelmersdale, UK.

In all cases Copper Substrate A was brush grained using a mechanical brush grainer, stock number 4428, supplied by PCB Machinery Limited, Haslingden, Rossendale, UK, rinsed with distilled water for 10 seconds and allowed to air dry, prior to coating.

Creo Trendsetter 3244—a commercially available plate setter, using Procomm Plus Software, operating at a wavelength of 830 nm at powers of up to 8 W and supplied by Creo Products Inc. of Burnaby, Canada.

Horsell Mercury Mark V Processor—a commercially available processor as supplied by Kodak Polychrome Graphics, Leeds, UK.

In each case imaging was carried out 1 day (which may be taken to mean 24 hours ±4 hours) after coating.

Examples 1 to 4

In examples 1 and 2, Prussian Blue and Resin E (at a ratio of 1:4, w:w) were ball milled together for four days such that the dispersed mill-base had a solids content of 30% in 1-methoxy-2-propyl acetate and a particle size of <10 microns as determined by grind gauge. In example 3, Prussian Blue and Resin L were milled as above. In example 4 carbon black FW2 and Resin E were milled as above. Subsequently, the coating formulations were prepared as solutions in 1-methoxypropan-2-ol : 1-methoxy-2-propyl acetate (50:50, w:w).

The substrate used was Copper Substrate A. The coating solutions were coated onto one side of the substrate by means of a wire wound bar.

For Example 1, the solution concentration was selected to provide the specified dry film composition with a coating weight of 3.5 gm$^{-2}$ after thorough drying, at 130° C. for 120 seconds.

For Example 2, the solution concentration was selected to provide the specified dry film composition with a coating weight of 5.0 gm$^{-2}$ after thorough drying, at 130° C. for 150 seconds.

For Examples 3 and 4 the solution concentration was selected to provide the specified dry film composition with a coating weight of 3.0 gm$^{-2}$ after thorough drying, at 130° C. for 150 seconds.

The compositions were as set out in Table 1 below.

TABLE 1

| Component | Examples | | | |
|---|---|---|---|---|
| | 1 | 2 | 3 | 4 |
| Resin E | 32 | 79 | | |
| PVEE | | 15 | | |
| Carbon Black | | | | 15 |
| Prussian Blue | 8 | 6 | 15 | |
| Resin J | 60 | | | |
| Resin L | | | 85 | 85 |

Example 1

A sample of the precursor was imaged on the Trendsetter 3244, using the internal test pattern, plot 0 at 8W, 300 mJcm$^{-2}$, 68 rpm.

The exposed precursor was then processed using a Mercury Mark V processor containing Developer A at 22.5° C. with a process speed of 1000 mm/min. At this imaging and developing condition, the 50% dots laid down by the platesetter were complete 50% dots on the substrate.

Example 2

A sample of the precursor was imaged on the Trendsetter 3244, using the internal test pattern, plot 0 at 8W, 300 mJcm$^{-2}$, 68 rpm.

The exposed precursor was then processed using a Mercury Mark V processor containing Developer A at 22.5° C. with a process speed of 1250 mm/min. At this imaging and developing condition, the 50% dots laid down by the platesetter were complete 50% dots on the substrate.

Examples 3 and 4

A sample of each printed circuit board precursor was imaged on the Trendsetter 3244, using the internal test pattern, plot 0 at 8W, 300 mJcm$^{-2}$, 66 rpm.

The exposed precursors were then processed by immersing in Developer B or D for 40 seconds at 22° C. At this imaging and developing condition, the 50% dots laid down by the platesetter were complete 50% dots on the substrate.

Example 5

The surface morphology of Copper Substrate A was tested. Measurements were taken with a Hommel Tester 500 using a stylus with a 90° cone angle and a 5 micron tip.

There appeared to be a grain, ie a rolling direction from manufacture, measurements were taken along and against (perpendicular to, on the same plane) the grain. The surface roughness parameters Ra and Rz were measured in accordance with DIN test 4777 and the instructions given with the instruction manual issued by Hommelwerke GmbH with the Hommel Tester T500. They are defined therein as follows:

Ra Arithmetic mean roughness value:

Arithmetic mean of the profile deviation of the filtered roughness profile from the centre line within the measuring length.

Rz Mean peak to valley height:

Arithmetic mean from the peak to valley heights of 5 successive sampling lengths in filtered roughness profile.

The tests were carried out three times and the results are given in Table 2 below, in microns.

TABLE 2

| Substrate | Measurement direction | Ra 1 | Ra 2 | Ra 3 | Rz 1 | Rz 2 | Rz 3 |
|---|---|---|---|---|---|---|---|
| Copper Substrate A | with grain | 0.18 | 0.18 | 0.18 | 1.42 | 1.26 | 1.46 |
| Copper Substrate A | against grain | 0.22 | 0.26 | 0.22 | 1.82 | 1.46 | 1.84 |

In the specification we refer in various places to UV and infra-red radiation. A person skilled in the art will be aware of the typical wavelength ranges of these radiations, and that there may be latitude at the margins of these ranges, and also that many sources emit a distribution of wavelengths. However, UV radiation typically has a wavelength range not exceeding about 450 nm. Infra-red radiation typically has a wavelength range of at least 600 nm. When we state in this specification that radiation is not UV-radiation we mean that any UV components of the wavelength distribution are minor, not significantly affecting the method. Likewise when we state that radiation is, for example, predominantly infrared radiation we mean that whilst there may be non-infrared components in the wavelength distribution these are not significant, in the method.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

We claim:

1. A method of making an electronic part, the method comprising:

(a) applying to a surface a liquid composition, the liquid composition comprising a solvent and an aqueous developer soluble polymeric substance including a polymer of general formula

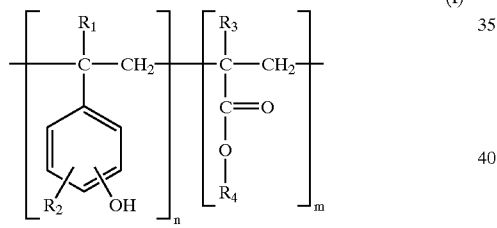

(I)

wherein $R^1$ represents a hydrogen atom or alkyl group, $R^2$ represents a hydrogen atom or alkyl group, $R^3$ represents a hydrogen atom or alkyl group, and $R^4$ represents an alkyl or hydroxyalkyl group, and wherein the ratio n/m is in the range 10/1 to 1/10;

(b) drying to remove the solvent, leaving on the surface a heat-sensitive coating comprising a heat-sensitive composition and a radiation-absorbing compound, to obtain a precursor of the electronic part;

(c) delivering heat selectively to regions of the precursor of the electronic part, wherein heat is delivered by radiation from a laser which emits radiation at above 600 nm to said precursor, and the radiation-absorbing compound absorbs the radiation and converts the radiation to heat, and wherein the aqueous developer solubility of the heat-sensitive composition is increased by the selective delivery of heat; and (d) developing the precursor in the aqueous developer to remove the heat-sensitive composition in regions to which heat was delivered to obtain the electronic part.

2. The method as claimed in claim 1, wherein $R^1$ represents a hydrogen atom or a $C_{1-4}$ alkyl group, $R^2$ represents a hydrogen atom or a $C_{1-4}$ alkyl group, $R^3$ represents a hydrogen atom or a $C_{1-4}$ alkyl group and $R^4$ represents a $C_{1-6}$ alkyl or $C_{1-6}$ hydroxyalkyl group.

3. A method as claimed in either of claim 1 or 2, wherein the heat-sensitive coating comprises at least 20% by weight of the polymer of general formula I.

4. The method as claimed in claim 1, wherein the surface is copper or a copper-rich alloy.

5. The method as claimed in claim 1, wherein the coating comprises a first layer including the radiation-absorbing compound, and a second layer comprising the polymer of general formula I.

6. A method of making an electronic part, the method comprising:

(a) applying to a surface a liquid composition, the liquid composition comprising a solvent and an aqueous developer soluble polymeric substance including a polymer of general formula

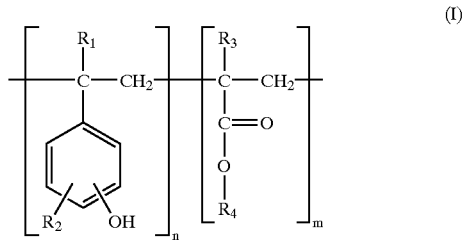

(I)

wherein $R^1$ represents a hydrogen atom or alkyl group, $R^2$ represents a hydrogen atom or alkyl group, $R^3$ represents a hydrogen atom or alkyl group, and $R^4$ represents an alkyl or hydroxyalkyl group, and wherein the ratio n/m is in the range 10/1 to 1/10;

(b) drying to remove the solvent, leaving on the surface a heat-sensitive coating comprising a heat-sensitive composition and a radiation-absorbing compound, to obtain a precursor of the electronic part;

(c) delivering heat selectively to regions of the precursor of the electronic part, wherein the heat is delivered from a heated body, and wherein the aqueous developer solubility of the heat-sensitive composition is increased by the selective delivery of heat; and (d) developing the precursor in the aqueous developer to remove the heat-sensitive composition in regions to which heat was delivered, to obtain the electronic part.

7. The method as claimed in claim 6, wherein $R^1$ represents a hydrogen atom or a $C_{1-4}$ alkyl group, $R^2$ represents a hydrogen atom or a $C_{1-4}$ alkyl group, $R^3$ represents a hydrogen atom or a $C_{1-4}$ alkyl group and $R^4$ represents a $C_{1-6}$ alkyl or $C_{1-6}$ hydroxyalkyl group.

8. The method as claimed in claim 6, wherein the heat-sensitive coating comprises at least 20% by weight of the polymer of general formula I.

9. The method as claimed in claim 6, wherein the surface is copper or a copper-rich alloy.

10. The method as claimed in claim 6, wherein the coating comprises a first layer including the radiation-absorbing compound, and a second layer comprising the polymer of general formula I.

* * * * *